(12) United States Patent
Lo et al.

(10) Patent No.: US 12,057,528 B2
(45) Date of Patent: Aug. 6, 2024

(54) MICRO LED DISPLAY DEVICE

(71) Applicant: PlayNitride Display Co., Ltd., Zhunan Township, Miaoli County (TW)

(72) Inventors: Yu-Yun Lo, Zhunan Township (TW); Bo-Wei Wu, Zhunan Township (TW); Chang-Feng Tsai, Zhunan Township (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 421 days.

(21) Appl. No.: 17/543,836

(22) Filed: Dec. 7, 2021

(65) Prior Publication Data

US 2023/0006106 A1 Jan. 5, 2023

(30) Foreign Application Priority Data

Jun. 30, 2021 (TW) .................................. 110123918

(51) Int. Cl.
*H01L 33/48* (2010.01)
*H01L 25/075* (2006.01)
(Continued)

(52) U.S. Cl.
CPC ........ *H01L 33/483* (2013.01); *H01L 25/0753* (2013.01); *H01L 33/12* (2013.01); *H01L 33/382* (2013.01)

(58) Field of Classification Search
CPC .................. H01L 33/382; H01L 33/483; H01L 25/0753; H01L 33/12; H01L 33/62;
(Continued)

(56) References Cited

U.S. PATENT DOCUMENTS

| 10,026,722 B1* | 7/2018 | Lo .......................... H01L 33/382 |
| 2005/0194605 A1* | 9/2005 | Shelton ................... H01L 33/62 257/99 |

(Continued)

FOREIGN PATENT DOCUMENTS

| CN | 110060582 A | 7/2019 |
| CN | 112467006 A | 3/2021 |

(Continued)

OTHER PUBLICATIONS

Taiwanese Office Action and Search Report dated Mar. 21, 2022 for Application No. 110123918.

(Continued)

*Primary Examiner* — Mouloucoulaye Inoussa
(74) *Attorney, Agent, or Firm* — Birch, Stewart, Kolasch & Birch, LLP

(57) ABSTRACT

A micro LED display device includes a display back plate having a first connecting electrode and a second connecting electrode, a micro LED structure disposed on the display back plate, and a first bonding structure and a second bonding structure disposed between the display back plate and the micro LED structure. The micro LED structure includes an epitaxial structure, and a first electrode and a second disposed on the side of the epitaxial structure closest to the display back plate. The orthogonal projections of the extension portions of the first electrode and the second electrode both exceed the orthogonal projection of the epitaxial structure on the display back plate. Neither orthogonal projection of the first bonding structure nor the orthogonal projection of the second bonding structure overlaps the orthogonal projection of the bottom surface of the epitaxial structure on the display back plate.

12 Claims, 8 Drawing Sheets

(51) Int. Cl.
*H01L 33/12* (2010.01)
*H01L 33/38* (2010.01)

(58) Field of Classification Search
CPC ... H01L 33/385; H01L 25/167; H01L 27/124; H01L 25/50; H01L 27/156; H01L 33/0093; H01L 27/1262; H01L 33/22; H01L 33/14; H01L 33/644; H01L 33/60; H01L 33/50; H01L 33/64; H01L 24/05; H01L 24/95; H01L 33/486; H01L 24/06; H01L 33/58; H01L 24/00; H01L 33/44; H01L 24/08; H01L 33/20; H01L 27/1214; H01L 2224/48091; H01L 2924/00014; H01L 2224/48227; H01L 2224/73265; H01L 2224/32225; H01L 2224/05655; H01L 2224/95001; H01L 2224/08225; H01L 2924/181; H01L 2924/10155; H01L 2933/0033; H01L 2224/05684; H01L 2224/80001; H01L 2224/2919; H01L 2924/12041; H01L 2224/05644; H01L 2224/0579; H01L 2224/05693
See application file for complete search history.

(56) References Cited

U.S. PATENT DOCUMENTS

| | | | | |
|---|---|---|---|---|
| 2006/0160257 A1* | 7/2006 | Wu | ............... | H01L 25/0753 438/22 |
| 2006/0163589 A1* | 7/2006 | Fan | ............... | H01L 27/153 257/E25.02 |
| 2006/0180818 A1* | 8/2006 | Nagai | ............... | F21K 9/00 257/89 |
| 2008/0087902 A1* | 4/2008 | Lee | ............... | H01L 27/153 257/E33.045 |
| 2009/0315045 A1* | 12/2009 | Horie | ............... | H01L 27/153 438/34 |
| 2011/0297914 A1* | 12/2011 | Zheng | ............... | H01L 33/46 257/13 |
| 2012/0241793 A1* | 9/2012 | In | ............... | H01L 33/486 438/22 |
| 2013/0320382 A1* | 12/2013 | Kojima | ............... | H01L 33/62 257/98 |
| 2014/0175471 A1* | 6/2014 | Akimoto | ............... | H01L 27/156 257/91 |
| 2017/0104027 A1 | 4/2017 | Lo et al. | | |
| 2017/0179097 A1* | 6/2017 | Zhang | ............... | H01L 25/167 |
| 2017/0323873 A1* | 11/2017 | Lin | ............... | H01L 24/05 |
| 2018/0012876 A1 | 1/2018 | Kim et al. | | |
| 2018/0013046 A1* | 1/2018 | Huang | ............... | H01L 33/62 |
| 2018/0053742 A1* | 2/2018 | Ting | ............... | H01L 24/81 |
| 2018/0175009 A1 | 8/2018 | Kim et al. | | |
| 2019/0165207 A1 | 5/2019 | Kim et al. | | |
| 2019/0393198 A1* | 12/2019 | Takeya | ............... | H01L 21/6838 |
| 2020/0075805 A1* | 3/2020 | Lai | ............... | H01L 33/22 |
| 2021/0013236 A1* | 1/2021 | Sakong | ............... | H01L 27/1214 |
| 2021/0020690 A1* | 1/2021 | Chen | ............... | H01L 33/644 |
| 2021/0083149 A1 | 3/2021 | Wu et al. | | |

FOREIGN PATENT DOCUMENTS

| | | |
|---|---|---|
| TW | 201916342 A | 4/2019 |
| TW | 201916343 A | 4/2019 |
| TW | 202105708 A | 2/2021 |
| TW | 202109867 A | 3/2021 |
| WO | WO 2021/017498 A1 | 2/2021 |

OTHER PUBLICATIONS

Chinese Office Action and Search Report dated Dec. 8, 2022 for Application No. 202110742709.9.

* cited by examiner

MICRO LED DISPLAY DEVICE

CROSS REFERENCE TO RELATED APPLICATIONS

This Application claims priority of Taiwan Patent Application No. 110123918, filed on Jun. 30, 2021, the entirety of which is incorporated by reference herein.

BACKGROUND

Technical Field

Embodiments of the present disclosure relate in general to a micro LED display device, and in particular they relate to a flip-chip micro LED display device.

Description of the Related Art

With the advancements being made in photoelectric technology, the size of photoelectric components is gradually becoming smaller. Compared to organic light-emitting diodes (OLED), micro light-emitting diodes (micro LED, mLED/μLED) have the advantages of higher efficiency, longer life, and relatively stable materials that are not as easily affected by the environment. Therefore, displays that use micro LEDs fabricated in arrays have gradually gained attention in the market.

With the miniaturization of micro LEDs, the area of the electrodes in each micro LED structure also shrinks, and the distance between the two electrodes is shortened. When multiple micro LED structures are subjected to a mass transfer process and bonded to the display back plate of a display device, phenomena such as short-circuiting of electrodes or bonding failure are prone to occur. This leads to dark spots in the micro LED display device, which lowers the overall yield.

SUMMARY

In the micro LED display device, each micro LED structure is (electrically) connected to the display back plate by two bonding structures. In the micro LED display device according to the embodiments of the present disclosure, the bonding structures are in direct contact with the extensions of the two electrodes of the micro LED structure. Due to the long distance between the extensions of the electrodes, the two bonding structures are prevented from contacting with each other. That is, short-circuiting of electrodes is unlikely to occur. In addition, during the bonding process, the epitaxial structure in the micro LED structure is not liable to be damaged, thereby reducing the probability of dark spots, and effectively improving the overall yield of the micro LED device.

Some embodiments of the present disclosure include a micro LED display device. The micro LED display device includes a display back plate having a first connecting electrode and a second connecting electrode. The micro LED display device also includes a micro LED structure disposed on the display back plate. The micro LED display device further includes a first bonding structure and a second bonding structure disposed between the display back plate and the micro LED structure. The micro LED structure includes an epitaxial structure. The micro LED structure also includes a first electrode and a second electrode electrically connected to the epitaxial structure and disposed on the side of the epitaxial structure closest to the display back plate. The first electrode has an extension portion, the second electrode has an extension portion, and the orthogonal projection of the extension portion of the first electrode on the display back plate and the orthogonal projection of the extension portion of the second electrode on the display back plate both exceed the orthogonal projection of the epitaxial structure on the display back plate. The first bonding structure is in direct contact with the extension portion of the first electrode and the first connecting electrode, and the second bonding structure is in direct contact with the extension portion of the second electrode and the second connecting electrode. Neither the orthogonal projection of the first bonding structure nor the orthogonal projection of the second bonding structure on the display back plate overlaps the orthogonal projection of the bottom surface of the epitaxial structure on the display back plate.

Some embodiments of the present disclosure include a micro LED display device. The micro LED display device includes a display back plate having a first connecting electrode and a second connecting electrode and divided into a display region and a non-display region surrounding the display region. The micro LED display device also includes a plurality of pixels arranged in an array in the display region. Each pixel includes a plurality of micro LED structures disposed on the display back plate. The micro LED structures emit lights with different colors. Each micro LED structure includes an epitaxial structure and a first electrode and a second electrode that are electrically connected to the epitaxial structure and disposed on the side of the epitaxial structure closest to the display back plate. Each pixel also includes a buffer layer formed on the outside of the epitaxial structure to connect the micro LED structures. The first electrode and the second electrode are disposed on the buffer layer. The first electrode has an extension portion, the second electrode has an extension portion, and the orthogonal projection of the extension portion of the first electrode on the display back plate and the orthogonal projection of the extension portion of the second electrode on the display back plate both exceed the orthogonal projection of the epitaxial structure on the display back plate. The micro LED display device further includes a first bonding structure and a second bonding structure disposed between the display back plate and the micro LED structures. The first bonding structure is in direct contact with the extension portion of the first electrode and the first connecting electrode, the second bonding structure is in direct contact with the extension portion of the second electrode and the second connecting electrode. Neither the orthogonal projection of the first bonding structure nor the orthogonal projection of the second bonding structure on the display back plate overlaps the orthogonal projection of a bottom surface of the epitaxial structure on the display back plate.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
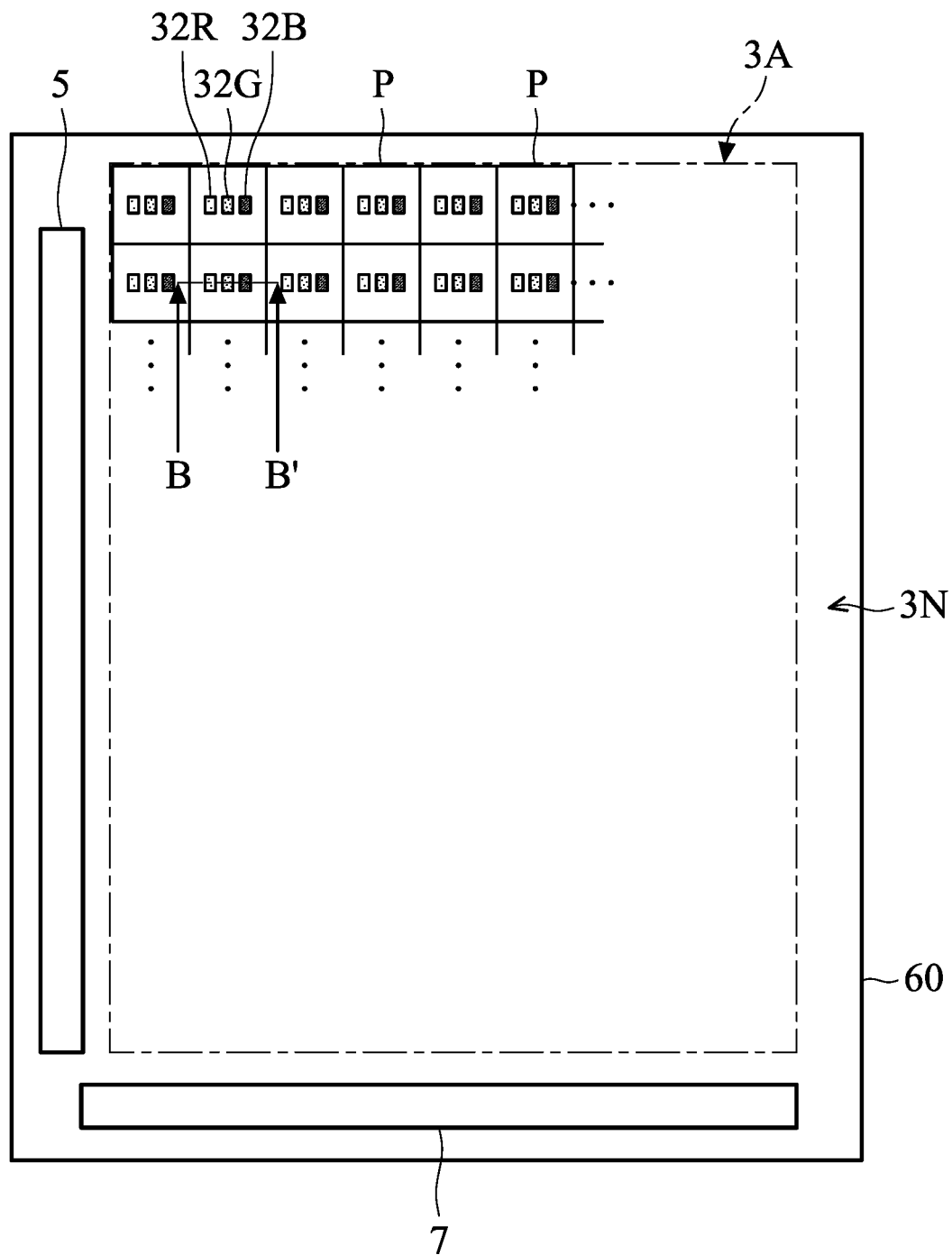
FIG. 1 is a partial circuit diagram of the micro LED display device 100 according to an embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +1-0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 2:
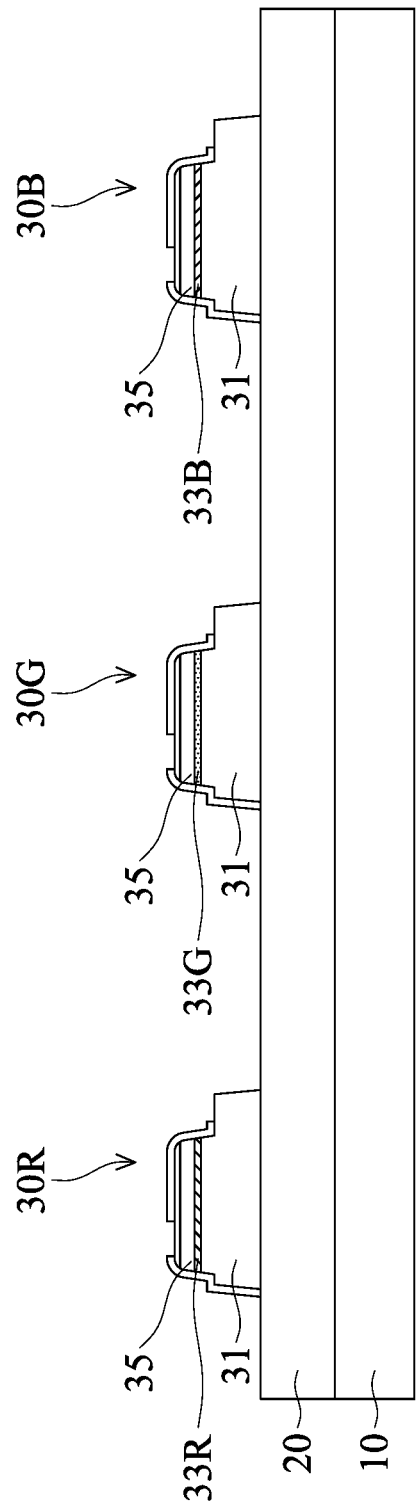
FIG. 2 is a partial cross-sectional view illustrating one stage of transferring the micro LED structures to the display back plate of the micro LED display device according to an embodiment of the present disclosure.
Figure 3:
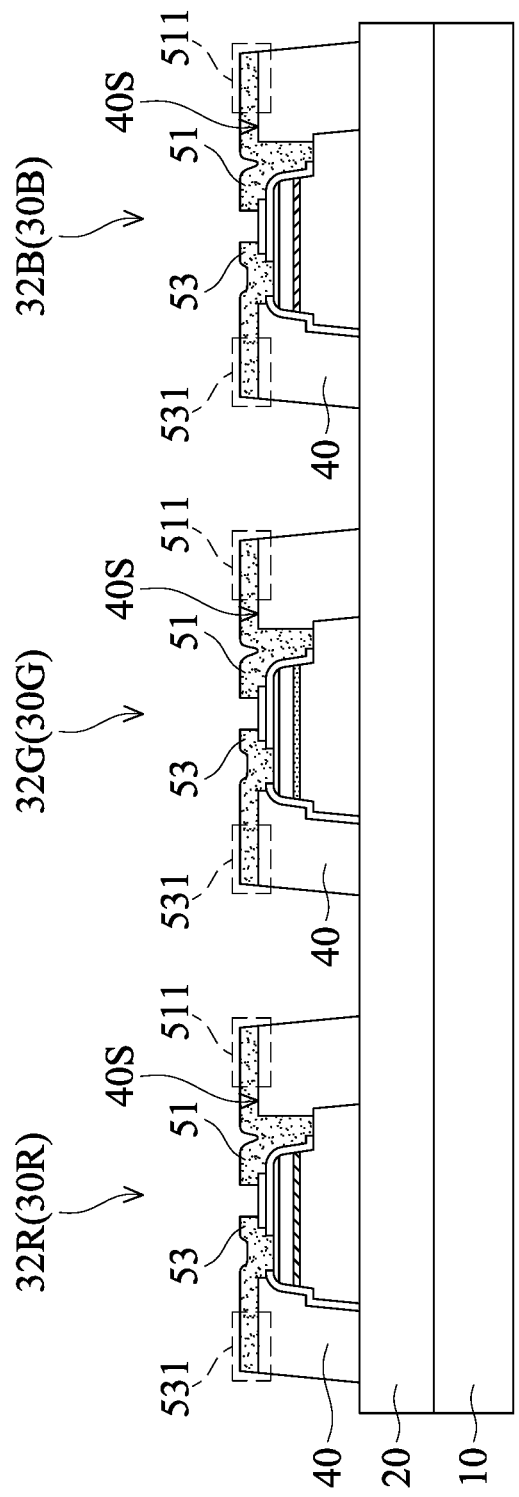
FIG. 3 is a partial cross-sectional view illustrating one stage of transferring the micro LED structures to the display back plate of the micro LED display device according to an embodiment of the present disclosure.
Figure 4:
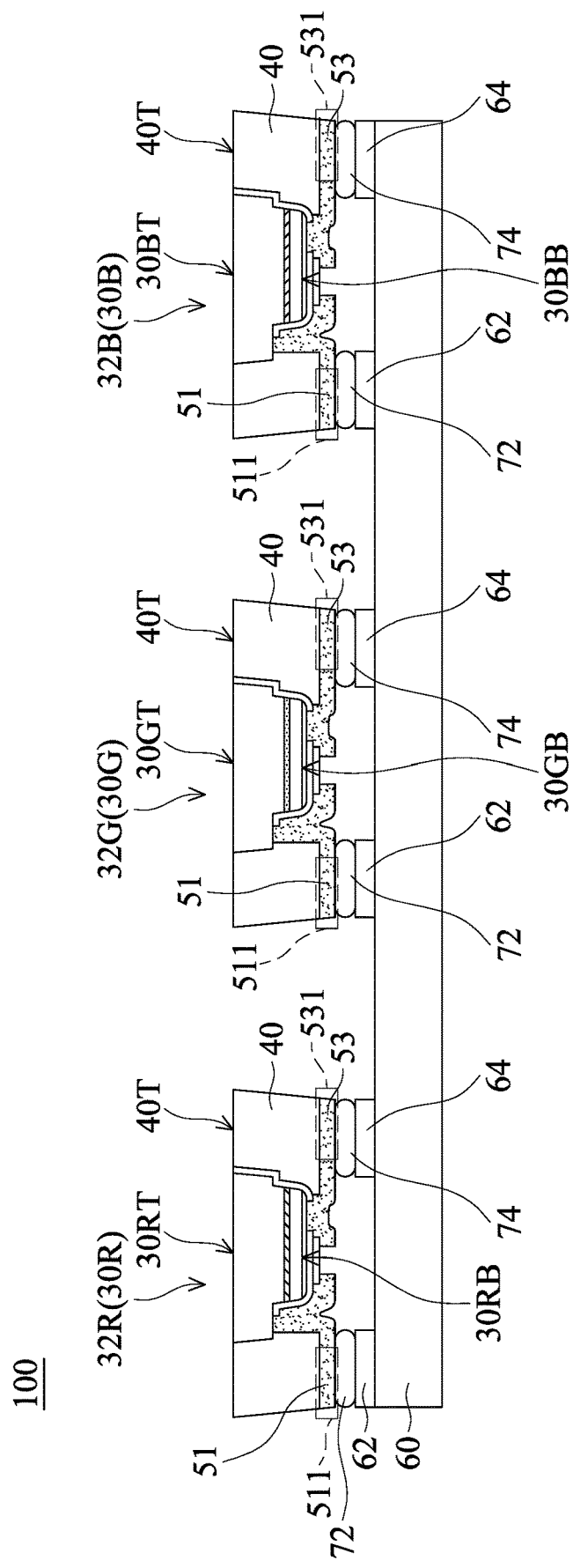
FIG. 4 is a partial cross-sectional view illustrating one stage of transferring the micro LED structures to the display back plate of the micro LED display device according to an embodiment of the present disclosure.

FIG. 1 is a partial circuit diagram of the micro LED display device 100 according to an embodiment of the present disclosure. FIG. 2 to FIG. 4 are partial cross-sectional views illustrating different stages of transferring the micro LED structures to the display back plate 60 of the micro LED display device 100 according to an embodiment of the present disclosure. It should be noted that some components have been omitted in FIG. 1 to FIG. 4 in order to show the technical features of the embodiments of the present disclosure more clearly. Moreover, FIG. 1 merely shows the arrangement and circuit connection relationship of the micro LED display device, and does not represent the actual structure of the micro LED display device.

Referring to FIG. 1, the micro LED display device 100 includes a display back plate 60 and a plurality of pixels P. The display back plate 60 has a display region 3A and a non-display region 3N surrounding the display region, and the pixels P are arranged in an array in the display region 3A. In some embodiments, as shown in FIG. 1, each pixel P includes three micro LED structures (e.g., micro LED structure 32R, micro LED structure 32G, and micro LED structure 32B), but the present disclosure is not limited thereto. In some other embodiments, each pixel P includes more than three micro LED structures, which may be adjusted according to actual needs. Moreover, as shown in FIG. 1, the micro LED display device 100 includes a scan driving circuit 5 and data driving circuit 7 disposed in the non-display region 3N.

Referring to FIG. 2, a plurality of epitaxial structures 30R, epitaxial structures 30G, and epitaxial structures 30B are arranged on a template 10. For example, the template 10 may include a plastic substrate, a ceramic substrate, a glass substrate, a sapphire substrate or any other non-circuit substrate, but the present disclosure is not limited thereto. The template 10 is used to carry a plurality of epitaxial structures 30R, epitaxial structures 30G, and epitaxial structures 30B. As shown in FIG. 2, the epitaxial structures 30R, the epitaxial structures 30G, and the epitaxial structures 30B may be arranged on the template 10 by an adhesion layer 20. For example, the adhesion layer 20 may include a high molecular polymer composed of the same molecular structure or multiple molecular structures as repeating units, and photo cracking or thermal cracking may be used to release the components adhered to it.

For example, the molecular bonding type of the repeating unit may be adjusted to absorb lights with different wavelengths. Under the corresponding wavelength (e.g., 100 nm to 400 nm) and energy, the light-absorbing group segment in the high molecular polymer may be photo-cracked into small molecular fragments to release the adhered components. The molecular chain of this type of light-absorbing group may include ethylene bond (C═C bond), hydrogen-oxygen bond (O—H, hydroxyl group), carbon-fluorine bond (C—F bond), carbon-hydrogen bond (C—H bond), nitrogen-hydrogen bond (N—H bond), nitrogen-nitrogen bond (N—N bond), azo bond (N═N bond), oxygen-oxygen bond (O—O, bond), peroxy bond (O═O bond), carbon-oxygen bond (C—O bond), carbon-carbon bond (C—C bond), carbon-chlorine bond (C—Cl bond), carbon-nitrogen bond (C—N bond), and so on, or a combination thereof.

Alternately, when the molecular structure type or molecular weight of the repeating unit is adjusted, different thermal cracking temperatures may be obtained. Under a set temperature (e.g., below 300° C.), the high molecular polymer may be thermally cracked into small molecular fragments to release the adhered components. The high molecular polymer may be polyethylene (PE), polypropylene (PP), polyesters, polyurethanes (PU), acrylate polymers, polyvinyl alcohol (PVA), polyvinyl acetate (PVA), polydimethylsiloxane, and so on, or its related copolymers. Alternately, the molecular chain of the high molecular polymer may include methyl group (—CH3), methylene bridge (—CH2-), benzene ring, ether linkage (—O—), ester linkage (—COO—), urethane linkage (—NH—COO—), urea linkage (—NH—CO—NH—), peptide linkage (—NH—CO—), silyl linkage (—Si—), imide linkage (—CO—N—CO—), and so on, or a combination thereof.

As shown in FIG. 2, in some embodiments, the epitaxial structure 30R includes a first-type semiconductor layer 31, a light-emitting layer 33R disposed on the first-type semiconductor layer 31, and a second-type semiconductor layer 35 disposed on the light-emitting layer 33R. The epitaxial structure 30G and the epitaxial structure 30B have a similar structure to the epitaxial structure 30R, and the difference is that the epitaxial structure 30G and the epitaxial structure 30B include a light-emitting layer 33G and a light-emitting layer 33B, respectively. For example, the light-emitting layer 33R may emit red light, the light-emitting layer 33G may emit green light, and the light-emitting layer 33B may emit blue light. That is, in this embodiment, the epitaxial structures of the micro LED structures that may emit red light, blue light, and green light are first transferred and arranged on the template 10, but the present disclosure is not limited thereto. In some other embodiments, multiple other epitaxial structures may be arranged on the template 10. For example, the light-emitting layers of these epitaxial structures may emit white light, cyan light. Magenta light, yellow light, any other color light, or a combination thereof.

In some embodiments, the first-type semiconductor layer 31 includes N-type semiconductor material. For example, the first-type semiconductor layer 31 may include a group II-VI material (e.g., zinc selenide (ZnSe)) or a group III-V nitrogen compound material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the first-type semiconductor layer 31 may include dopants such as silicon (Si) or germanium (Ge), but the present disclosure is not limited thereto. Moreover, the first-type semiconductor layer 31 may be a single-layer or multi-layer structure.

In some embodiments, the light-emitting layer 33R, the light-emitting layer 33G, and the light-emitting layer 33B include at least one undoped semiconductor layer or at least one low-doped semiconductor layer. For example, each of the light-emitting layer 33R, the light-emitting layer 33G, and the light-emitting layer 33B may be a quantum well (QW) layer, which may include indium gallium nitride ($In_xGa_{1-x}N$) or gallium nitride (GaN), but the present disclosure is not limited thereto. In some examples, each of the light-emitting layer 33R, the light-emitting layer 33G, and the light-emitting layer 33B may be a multiple quantum well (MQW) layer, but the present disclosure is not limited thereto.

In some embodiments, the second-type semiconductor layer 35 includes P-type semiconductor material. For example, the second-type semiconductor layer 35 may include a group II-VI material (e.g., zinc selenide (ZnSe)) or a group III-V nitrogen compound material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the second-type semiconductor layer 35 may include dopants such as magnesium (Mg) or carbon (C), but the present disclosure is not limited thereto. Moreover, the second-type semiconductor layer 35 may be a single-layer or multi-layer structure.

Then, as shown in FIG. 3, a patterned buffer layer 40 is formed on the adhesion layer 20, and the buffer layer 40 surrounds the epitaxial structure 30R, the epitaxial structure 30G, and the epitaxial structure 30B. In some embodiments, the buffer layer 40 includes a dielectric material, such as silicon oxide, silicon nitride, silicon oxynitride, low-κ dielectric material, aluminum oxide, aluminum nitride, the like, or a combination thereof, but the present disclosure is not limited thereto. For example, the buffer layer 40 may also be a structural photoresist. In some embodiments, the Young's modulus of the buffer layer 40 is less than the Young's modulus of the epitaxial structure 30R, the epitaxial structure 30G, and the epitaxial structure 30B.

In more detail, the buffer layer 40 may first form a flat layer on the template 10 and the epitaxial structures by a deposition process. The deposition process may, for example, include chemical vapor deposition (CVD), atomic layer deposition (ALD), spin-on coating, the like, or a combination thereof, but the present disclosure is not limited thereto. Then, a patterning process is performed on the flat layer to expose a portion of each of the epitaxial structure 30R, the epitaxial structure 30G, and the epitaxial structure 30B (e.g., the first-type semiconductor layer 31 and the second-type semiconductor layer 35) and a portion of the adhesion layer 20 (or the template 10). For example, the patterning process may include forming a mask layer (not shown) on the aforementioned material, and then etching the portion of the aforementioned material that is not covered by the mask layer to form a patterned buffer layer 40, but the present disclosure is not limited thereto.

Then, a first electrode 51 and a second electrode 53 are formed on each of the epitaxial structure 30R, the epitaxial structure 30G, and the epitaxial structure 30B to form a micro LED structure 32R, a micro LED structure 32G, and a micro LED structure 32B. The first electrode 51 is electrically connected to the first-type semiconductor layer 31, and the second electrode 53 is electrically connected to the second-type semiconductor layer 35. As shown in FIG. 3, the first electrode 51 and the second electrode 53 are formed on the buffer layer 40. In particular, the first electrode 51 and the second electrode 53 are filled in the trenches of the patterned buffer layer 40 and extend on the surface 40S of the buffer layer 40 so as to be electrically connected to the first-type semiconductor layer 31 and the second-type semiconductor layer 35, but the present disclosure is not limited thereto. For example, the first electrode 51 and the second electrode 53 may be formed by a deposition process and a patterning process, but the present disclosure is not limited thereto. The examples of the deposition process and the patterning process are described above and will not be repeated here.

In some embodiments, the first electrode 51 and the second electrode 53 includes a conductive material, such as metal, metal silicide, the like, or a combination thereof, but the present disclosure is not limited thereto. For example, the metal may include gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto.

In some embodiments, the first electrode 51 has an extension portion 511 (i.e. the dashed circle in FIG. 3), and the orthogonal projection of the extension portion 511 of the first electrode 51 on the template 10 exceeds the orthogonal projection of the epitaxial structure 30R (or the epitaxial structure 30G or the epitaxial structure 30B) on the template 10. That is, the orthogonal projection of the extension portion 511 of the first electrode 51 on the template 10 does not overlap the orthogonal projection of the epitaxial structure 30R (or the epitaxial structure 30G or the epitaxial structure 30B) on the template 10. Similarly, the second electrode 53 has an extension portion 531 (i.e. the dashed circle in FIG. 3), and the orthogonal projection of the extension portion 531 of the second electrode 53 on the template 10 exceeds the orthogonal projection of the epitaxial structure 30R (or the epitaxial structure 30G or the epitaxial structure 30B) on the template 10. That is, the orthogonal projection of the extension portion 531 of the second electrode 53 on the template 10 does not overlap the orthogonal projection of the epitaxial structure 30R (or the epitaxial structure 30G or the epitaxial structure 30B) on the template 10.

Referring to FIG. 4, the micro LED structure 32R, the micro LED structure 32G, and the micro LED structure 32B on the template 10 are transferred to a display back plate 60 to form the micro LED display device 100. In particular, a plurality micro LED structures 32R, micro LED structures 32G, and micro LED structures 32B may be mass transferred from the template 10 to the display back plate 60, and are bonded to the display back plate 60 by a plurality of bonding structures (72, 74). Moreover, FIG. 4 may be a partial cross-sectional view along line B-B' in FIG. 1, but the present disclosure is not limited thereto.

In some embodiments, the display back plate 60 has a plurality of first connecting electrodes 62 and second connecting electrodes 64 to electrically connected to the first electrode 51 and the second electrode 53 of each of the micro LED structure 32R, the micro LED structure 32G, and the micro LED structure 32B. That is, the first electrode 51 and the second electrode 53 are electrically connected to the corresponding epitaxial structure (e.g., the epitaxial structure 30R, the epitaxial structure 30G, or the epitaxial structure 30B) and disposed on the side of the epitaxial structure closest to the display back plate 60. The first connecting electrode 62 and the second connecting electrode 64 include a conductive material. The examples of the conductive material are described above and will not be repeated here.

Moreover, as shown in FIG. 4, in some embodiments, the micro LED display structure 100 includes a plurality of first bonding structures 72 and second bonding structures 74 disposed between the display back plate 60 and the micro LED structure 32R, the micro LED structure 32G, and the micro LED structure 32B. The first bonding structure 72 is used to connect the first electrode 51 of each epitaxial structure and the corresponding first connecting electrode 62, and the second bonding structure 74 is used to connect the second electrode 53 of each epitaxial structure and the corresponding second connecting electrode 64.

In particular, the extension portion 511 (i.e. the dashed circle in FIG. 3) of the first electrode 51 is in direct contact with the first bonding structure 72, and the extension portion 531 (i.e. the dashed circle in FIG. 3) of the second electrode 53 is in direct contact with the second bonding structure 74. In some embodiments, as shown in FIG. 4, the first bonding structure 72 is merely formed on the extension portion 511 of the first electrode 51, and the second bonding structure 74 is merely formed on the extension portion 531 of the second electrode 53. In some embodiments, the orthogonal projection of the extension portion 511 of the first electrode 51 on the display back plate 60 and the orthogonal projection of the extension portion 531 of the second electrode 53 on the display back plate 60 both exceed the orthogonal projection of the epitaxial structure (32R, 32G, or 32B) on the display back plate 60.

Due to the long distance between the extension portion 511 of the first electrode 51 and the extension portion 531 of the second electrode 53, the first bonding structure 72 (that is in direct contact with the extension portion 511 of the first electrode 51) and the second bonding structure 74 (that is in direct contact with the extension portion 531 of the second electrode 53) are prevented from contacting with each other. Therefore, short-circuiting of electrodes is unlikely to occur during the bonding process.

In some embodiments, neither the orthogonal projection of the first bonding structure 72 nor the orthogonal projection of the second bonding structure 74 on the display back plate 60 overlaps the orthogonal projection of the corresponding epitaxial structure (30R, 30G, or 30B) on the display back plate 60. In particular, as shown in FIG. 4, in some embodiments, neither the orthogonal projection of the first bonding structure 72 nor the orthogonal projection of the second bonding structure 74 on the display back plate 60 overlaps the orthogonal projection of the bottom surface (30RB, 30GB, or 30BB) of the corresponding epitaxial structure (30R, 30G, or 30B) on the display back plate 60. That is, the orthogonal projection of the first bonding structure 72 and the orthogonal projection of the second bonding structure 74 on the display back plate 60 and the orthogonal projection of the corresponding epitaxial structure on the display back plate 60 hardly overlap or the overlap ratio is low. Therefore, when the bonding process (e.g., including a pressing process) is performed, cracks of the epitaxial structure may be effectively prevented. That is, in some embodiments, during the bonding process, the epitaxial structure in the micro LED structure is not liable to be damaged, thereby reducing the probability of dark spots, and effectively improving the overall yield of the micro LED device 100.

In some embodiments, the ratio of the area of the orthogonal projection of each epitaxial structure (30R, 30G, or 30B) on the display back plate 60 to the area of the orthogonal projection of the corresponding micro LED structure (32R, 32G, or 32B) on the display back plate 60 is greater than about 50% and less than about 70%. If the ratio is greater than 70%, the area of the extension portion of the electrode (e.g., the extension portion 511 of the first electrode 51 or the extension portion 531 of the second electrode 53) of the micro LED structure is too small, so that the bonding area is insufficient, which may result in low bonding yield; if the ratio is less than 50%, the space occupied by the micro LED structure is too large, which may cause a waste of space.

As shown in FIG. 4, in some embodiments, the top surface (30RT, 30GT, or 30BT) of the epitaxial structure (30R, 30G, or 30B) and the top surface 40T of the buffer layer 40 are coplanar. Here, the top surface of the epitaxial structure is defined as the surface of the epitaxial structure away from the display back plate 60, and the top surface 40T of the buffer layer 40 is defined as the surface of the buffer layer 40 away from the display back plate 60. Moreover, since the first electrode 51 and the second electrode 53 are formed on the surface of the buffer layer 40 facing the display back plate 60, the surface of the buffer layer 40 facing the display back plate 60 may not be in direct contact with the display back plate 60.

Figure 5:
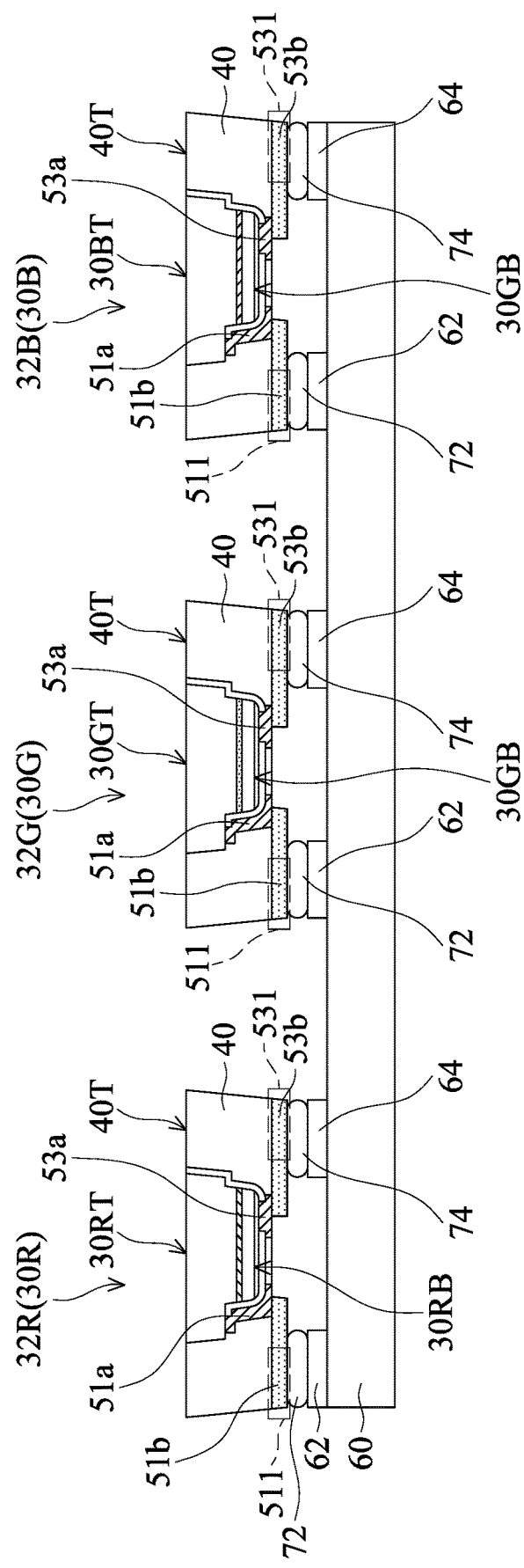
FIG. 5 is a partial cross-sectional view illustrating the micro LED display device according to another embodiment of the present disclosure.

FIG. 5 is a partial cross-sectional view illustrating the micro LED display device 102 according to another embodiment of the present disclosure. Similarly, some components of the micro LED display device 102 have been omitted in FIG. 5 in order to show the technical features of the embodiments of the present disclosure more clearly.

The micro LED display device 102 in this embodiment is similar to the micro LED display device 100 in FIG. 4, and the main difference lies in the structure of the electrodes. In some embodiments, when forming an epitaxial structure (e.g., epitaxial structure 30R, epitaxial structure 30G, and epitaxial structure 30B) on an epitaxial growth substrate (not shown), the bottom electrodes 51a, 53a (which may also be called ohmic contact electrodes) are prepared first, and the bottom electrodes 51a, 53a are connected to the epitaxial structure (in direct contact with the epitaxial structure). In particular, in some embodiments, the bottom electrode 51a is electrically connected to the first-type semiconductor layer 31 of the epitaxial structure, and the bottom electrode 53a is electrically connected to the second-type semiconductor layer 35 of the epitaxial structure. In other words, the bottom electrodes 51a, 53a are formed on an epitaxial growth substrate with an epitaxial structure, and then the epitaxial structure with the bottom electrodes 51a, 53a are arranged on a template (e.g., template 10), and then the buffer layer 40 and upper electrodes 51b, 53b are formed. In particular, the upper electrode 51b is connected to the bottom electrode 51a to form a first electrode 51, and the upper electrode 53b is connected to the bottom electrode 53a to form a second electrode 53. In some embodiments, as shown in FIG. 5, the first electrode 51 has an extension portion 511 (i.e. the dashed circle in FIG. 5), and the second electrode 53 has an extension portion 531 (i.e. the dashed circle in FIG. 5).

In some embodiments, the bottom electrode 51a, the upper electrode 51b, the bottom electrode 53a, and the upper electrode 53b include a conductive material. The examples of the conductive material are described above and will not be repeated here. In some embodiments, the material of the bottom electrode 51a is different from the material of the upper electrode 51b, or the material of the bottom electrode 53a is different from the material of the upper electrode 53b. In some other embodiments, the material of the bottom electrode 51a is the same as the material of the upper electrode 51b, or the material of the bottom electrode 53a is the same as the material of the upper electrode 53b. The materials of the bottom electrode 51a, the upper electrode 51b, the bottom electrode 53a, and the upper electrode 53b may be selected according to actual needs.

Similarly, the extension portion 511 (i.e. the dashed circle in FIG. 5) of the upper electrode 51b is in direct contact with the first bonding structure 72, and the extension portion 531 (i.e. the dashed circle in FIG. 5) of the upper electrode 53b is in direct contact with the second bonding structure 74. The orthogonal projection of the extension portion 511 (or 531) of the upper electrode 51b (or 53b) on the display back plate 60 exceeds the orthogonal projection of the epitaxial structure (32R, 32G, or 32B) on the display back plate 60. Neither the orthogonal projection of the first bonding structure 72 nor the orthogonal projection of the second bonding structure 74 on the display back plate 60 overlaps the orthogonal projection of the corresponding epitaxial structure on the display back plate 60. In particular, in some embodiments, neither the orthogonal projection of the first bonding structure 72 nor the orthogonal projection of the second bonding structure 74 on the display back plate 60 overlaps the orthogonal projection of the bottom surface (30RB, 30GB, or 30BB) of the corresponding epitaxial structure (30R, 30G, or 30B) on the display back plate 60.

Figure 6:
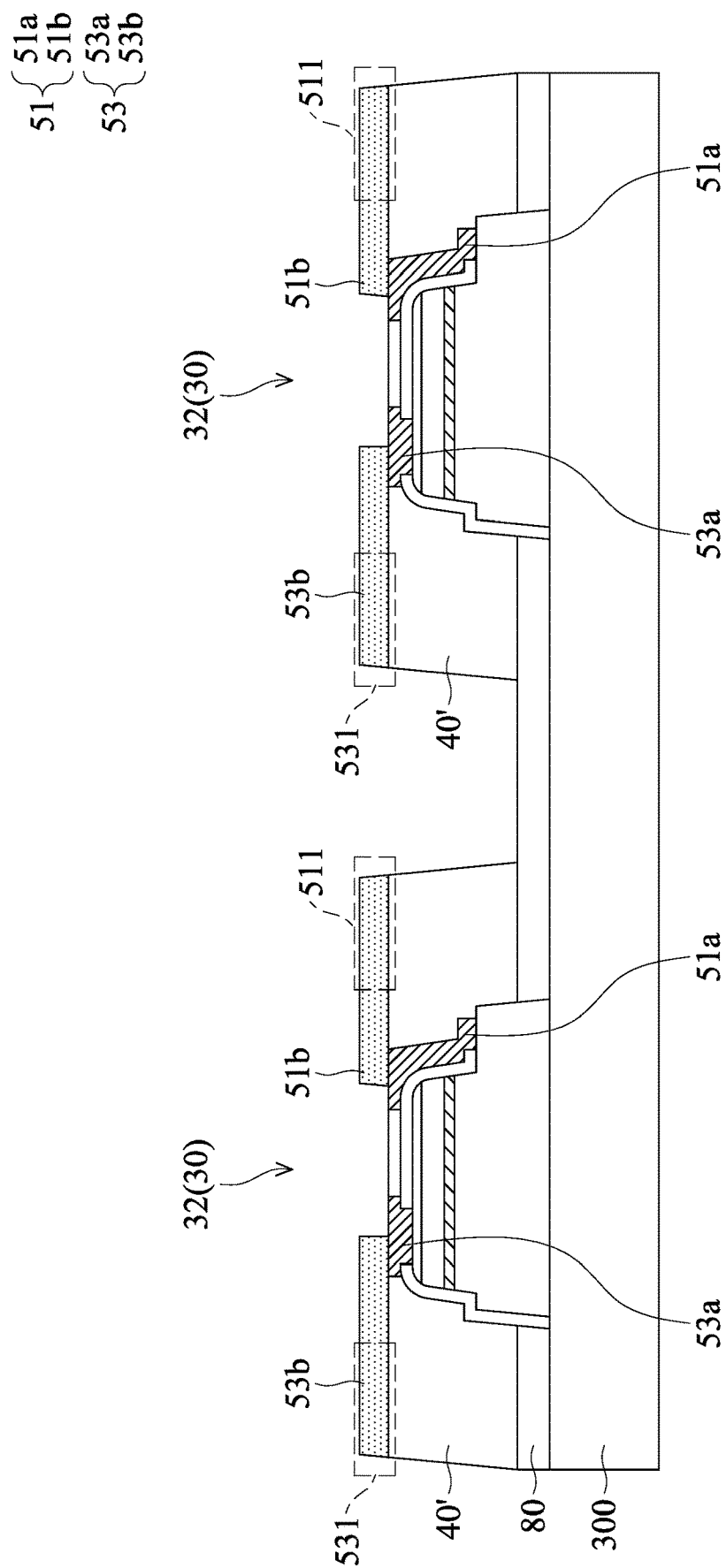
FIG. 6 is a partial cross-sectional view illustrating one stage of transferring the micro LED structures to the display back plate of the micro LED display device according to another embodiment of the present disclosure.
Figure 7:
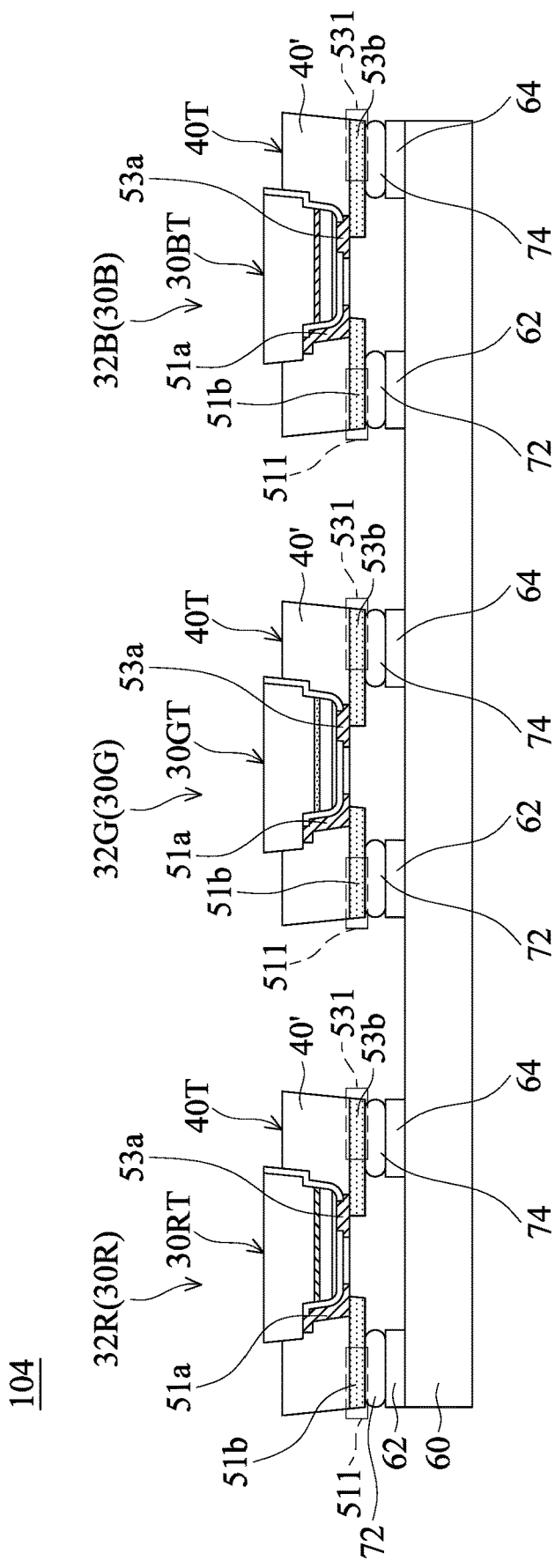
FIG. 7 is a partial cross-sectional view illustrating one stage of transferring the micro LED structures to the display back plate of the micro LED display device according to another embodiment of the present disclosure.

FIG. 6 and FIG. 7 are partial cross-sectional views illustrating various stages of transferring the micro LED structures to the display back plate 60 of the micro LED display device 104 according to another embodiment of the present disclosure. Similarly, some components have been omitted in FIG. 6 and FIG. 7 in order to show the technical features of the embodiments of the present disclosure more clearly.

Referring to FIG. 6, epitaxial structures 30 are formed on an epitaxial growth substrate 300. In some embodiments, the epitaxial structures 30 may be formed on the epitaxial growth substrate 300 by an epitaxial growth process. In some embodiments, the epitaxial growth substrate 300 is a semiconductor substrate. For example, the epitaxial growth substrate 300 may include silicon, silicon germanium, gallium nitride, gallium arsenide, any other applicable semiconductor material, or a combination thereof. In some embodiments, the epitaxial growth substrate 300 is a semiconductor-on-insulator substrate, such as a silicon-on-insulator (SOI) substrate. In some embodiments, the epitaxial growth substrate 300 is a glass substrate or a ceramic substrate. For example, the epitaxial growth substrate 300 may include silicon carbide (SiC), aluminum nitride (AlN), glass, or sapphire. However, the present disclosure is not limited thereto.

In some embodiments, the bottom electrode 51a and the bottom electrode 53a are formed on each epitaxial structure 30. The bottom electrode 51a is electrically connected to the first-type semiconductor layer 31, and the bottom electrode 53a is electrically connected to the second-type semiconductor layer 35. Then, a debonding layer 80 is formed on the epitaxial growth substrate 300. The debonding layer 80 surrounds the epitaxial structure 30 and is adjacent to the bottom of the epitaxial structure 30. For example, the debonding layer 80 may include an epitaxial material (e.g., gallium nitride (GaN)) or a high molecular polymer with a light-absorbing group. Take high molecular polymer as an example, under the corresponding wavelength (e.g., 100 nm to 400 nm) and energy, the light-absorbing group segment in the high molecular polymer may be photo-cracked into small molecular fragments to release the adhered components. The molecular chain of this type of light-absorbing group may include ethylene bond (C═C bond), hydrogen-oxygen bond (O—H, hydroxyl group), carbon-fluorine bond (C—F bond), carbon-hydrogen bond (C—H bond), nitrogen-hydrogen bond (N—H bond), nitrogen-nitrogen bond (N—N bond), azo bond (N═N bond), oxygen-oxygen bond (O—O, bond), peroxy bond (O═O bond), carbon-oxygen bond (C—O bond), carbon-carbon bond (C—C bond), carbon-chlorine bond (C—Cl bond), carbon-nitrogen bond (C—N bond), and so on, or a combination thereof. Moreover, the thickness of the debonding layer 80 may be in the range from about 0.1 μm to 5 μm, but the present disclosure is not limited thereto.

Then, a buffer layer 40' is formed on each epitaxial structure 30 and the debonding layer 80, and the buffer layer 40' surrounds the epitaxial structure 30. The examples of the material and the manufacturing method of the buffer layer 40' are described above and will not be repeated here. Then, an upper electrode 51b and an upper electrode 51b are formed on the buffer layer 40', and the upper electrode 51b and the upper electrode 51b are connected to a bottom electrode 51a and a bottom electrode 53a, respectively. Similarly, the upper electrode 51b is connected to the bottom electrode 51a to form a first electrode 51, and the upper electrode 53b is connected to the bottom electrode 53a to form a second electrode 53.

The orthogonal projection of the extension portion 511 (i.e. the dashed circle in FIG. 6) of the upper electrode 51b of the first electrode 51 on the epitaxial growth substrate 300 exceeds the orthogonal projection of the epitaxial structure 30 on the epitaxial growth substrate 300. That is, the orthogonal projection of the extension portion 511 of the upper electrode 51b of the first electrode 51 on the epitaxial growth substrate 300 does not overlap the orthogonal projection of the epitaxial structure 30 on the epitaxial growth substrate 300. Similarly, the orthogonal projection of the extension portion 531 (i.e. the dashed circle in FIG. 6) of the upper electrode 53b of the second electrode 53 on the epitaxial growth substrate 300 exceeds the orthogonal projection of the epitaxial structure 30 on the epitaxial growth substrate 300. That is, the orthogonal projection of the extension portion 531 of the upper electrode 53b of the second electrode 53 on the epitaxial growth substrate 300 does not overlap the orthogonal projection of the epitaxial structure 30 on the epitaxial growth substrate 300.

The epitaxial structure 30, the first electrode 51, the second electrode 53, and the buffer layer 40' may be regarded as a micro LED structure 32. Then, the micro LED structures 32 on the epitaxial growth substrate 300 are transferred to and arranged on a template, or selectively transferred to a display back plate. For example, the micro LED structures 32 may be removed from the debonding layer 80 by Laser lift-Off (LLO), and the micro LED structures 32 are placed on a template, and then the micro LED structures 32 are selectively mass transferred to the display back plate.

Referring to FIG. 7, the micro LED structure 32R, the micro LED structure 32G, and the micro LED structure 32G that emit different colors (and correspond to the micro LED structure 32 in FIG. 6) are transferred onto the display back plate 60 to form the micro LED display device 104.

Similarly, as shown in FIG. 7, in some embodiments, the display back plate 60 has a plurality of first connecting electrodes 62 and second connecting electrodes 64 to electrically connected to the first electrode 51 and the second electrode 53 of each of the micro LED structure 32R, the micro LED structure 32G, and the micro LED structure 32B. Moreover, as shown in FIG. 7, in some embodiments, the micro LED display structure 104 includes a plurality of first bonding structures 72 and second bonding structures 74 disposed between the display back plate 60 and the micro LED structure 32R, the micro LED structure 32G, and the micro LED structure 32B. The first bonding structure 72 is used to connect the first electrode 51 of each epitaxial structure and the corresponding first connecting electrode 62, and the second bonding structure 74 is used to connect the second electrode 53 of each epitaxial structure and the corresponding second connecting electrode 64.

Similarly, as shown in FIG. 7, in some embodiments, the orthogonal projection of the extension portion 511 (i.e. the dashed circle in FIG. 7) of the upper electrode 51b of the first electrode 51 and the orthogonal projection of the extension portion 531 (i.e. the dashed circle in FIG. 6) of the upper electrode 53b of the second electrode 53 on the display back plate 60 both exceed the orthogonal projection of the epitaxial structure (30R, 30R, or 30B) on the display back plate 60. Moreover, as shown in FIG. 7, in some embodiments, the first bonding structure 72 and the second bonding structure 74 are in direct contact with the extension portion 511 of the upper electrode 51b and the extension portion 531 of the upper electrode 53b, respectively.

In some embodiments, the top surface 30RT (or 30GT or 30BT) of the epitaxial structure 30R (30G or 30B) is higher than the top surface 40T' of the buffer layer 40'. Here, the top surface 30RT (or 30GT or 30BT) of the epitaxial structure 30R (30G or 30B) is defined as the surface of the epitaxial structure 30R (30G or 30B) away from the display back plate 60, and the top surface 40T' of the buffer layer 40' is defined as the surface of the buffer layer 40' away from the display back plate 60. In other words, the distance between the top surface 30RT (or 30GT or 30BT) of the epitaxial structure 30R (30G or 30B) and the display back plate 60 is greater than the distance between the top surface 40T' of the buffer layer 40' and the display back plate 60.

Figure 8:
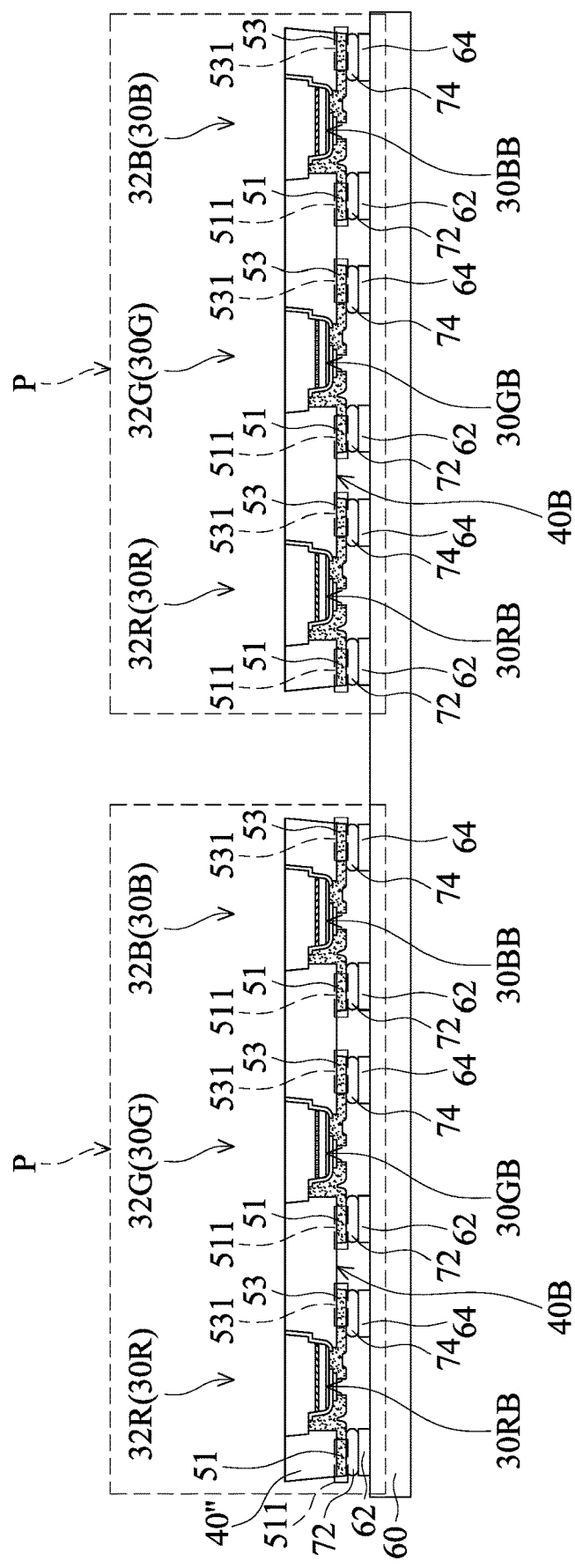
FIG. 8 is a partial cross-sectional view illustrating the micro LED display device 106 according to an embodiment of the present disclosure.

FIG. 8 is a partial cross-sectional view illustrating the micro LED display device 106 according to an embodiment of the present disclosure. Similarly, some components of the micro LED display device 106 have been omitted in FIG. 8 in order to show the technical features of the embodiments of the present disclosure more clearly.

Referring to FIG. 8, in some embodiments, the micro LED structure 32R, the micro LED structure 32G, and the micro LED structure 32B may be connected to each other by the buffer layer 40". For example, similar to the arrangement shown in FIG. 2, but in this embodiment, the epitaxial structure 30R, the epitaxial structure 30G, and the epitaxial structure 30B that emit different colors are first arranged on the template 10 according to the pixel design. Then, the buffer layer 40" is formed on the template 10. The buffer layer 40" is formed on the outside of the epitaxial structure 30R, the epitaxial structure 30G, and the epitaxial structure 30B to connect the epitaxial structure 30R, the epitaxial structure 30G, and the epitaxial structure 30B. Then, a first electrode 51 and a second electrode 53 are formed on each of the epitaxial structure 30R, the epitaxial structure 30G, and the epitaxial structure 30B to form a pixel combination composed of a micro LED structure 32R, a micro LED structure 32G, and a micro LED structure 32B.

Finally, the pixel combination composed of at least one group (usually multiple groups) of the micro LED structure 32R, the micro LED structure 32G, and the micro LED structure 32B that are connected to each other by the buffer layer 40" is transferred to the display back plate 60, so as to form the micro LED display device 106. In other words, it may be transferred in units of one pixel P (that includes a micro LED structure 32R, a micro LED structure 32G, and a micro LED structure 32B) as shown in FIG. 1 by the buffer layer 40", but the present disclosure is not limited thereto. In more detail, in the same pixel P, the micro LED structure 32R, the micro LED structure 32G, and the micro LED structure 32B that emit different colors are connected to each other, and the side surfaces of the epitaxial structure 30R, the epitaxial structure 30G, and the epitaxial structure 30B are covered by the buffer layer 40", but the buffer layers 40" of different pixels P are separated.

In the embodiment shown in FIG. 8, the buffer layer 40" connects one micro LED structure 32R, one micro LED structure 32G, and one micro LED structure 32B to each other, but the present disclosure is not limited thereto. The number of micro LED structures connected to the buffer layer 40" and the color light emitted by these micro LED structures may be adjusted according to actual needs. Moreover, the buffer layer 40" is formed on the template 10 and transferred to the display back plate 60 with the surrounding epitaxial structure 30R, epitaxial structure 30G, and epitaxial structure 30B. Therefore, in some embodiments, the bottom surface 40B of the buffer layer 40" and the surface of the display back plate 60 have a gap and are separated from each other.

In summary, in the micro LED display device according to the embodiments of the present disclosure, the bonding structures are in direct contact with the extensions of the two electrodes of the micro LED structure. Due to the long distance between the extensions of the electrodes, the two bonding structures do not easily come in contact with each other. That is, short-circuiting of electrodes is unlikely to occur. In addition, during the bonding process, the epitaxial structure in the micro LED structure is not easily damaged, thereby reducing the probability of dark spots, and effectively improving the overall yield of the micro LED device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro LED display device, comprising:
   a display back plate having a first connecting electrode and a second connecting electrode;
   a micro LED structure disposed on the display back plate, wherein the micro LED structure comprises:
      an epitaxial structure; and
      a first electrode and a second electrode electrically connected to the epitaxial structure and disposed on a side of the epitaxial structure closest to the display back plate, wherein the first electrode has an extension portion, the second electrode has an extension portion, and an orthogonal projection of the extension portion of the first electrode on the display back plate and an orthogonal projection of the extension portion of the second electrode on the display back plate both exceed an orthogonal projection of the epitaxial structure on the display back plate; and
   a first bonding structure and a second bonding structure disposed between the display back plate and the micro LED structure, wherein the first bonding structure is in direct contact with the extension portion of the first electrode and the first connecting electrode, the second bonding structure is in direct contact with the extension portion of the second electrode and the second connecting electrode, and neither an orthogonal projection of the first bonding structure nor an orthogonal projection of the second bonding structure on the display back plate overlaps an orthogonal projection of a bottom surface of the epitaxial structure on the display back plate.

2. The micro LED display device as claimed in claim 1, wherein a ratio of an area of the orthogonal projection of the epitaxial structure on the display back plate to an area of an orthogonal projection of the micro LED structure on the display back plate is greater than 50% and less than 70%.

3. The micro LED display device as claimed in claim 1, wherein the first electrode comprises:
   a first bottom electrode connected to the epitaxial structure; and
   a first upper electrode connected to the first bottom electrode, wherein the extension portion of the first electrode is disposed on the first upper electrode;
   wherein the second electrode comprises:
   a second bottom electrode connected to the epitaxial structure; and
   a second upper electrode connected to the second bottom electrode, wherein the extension portion of the second electrode is disposed on the second upper electrode.

4. The micro LED display device as claimed in claim 3, wherein a material of the first bottom electrode is different from a material of the first upper electrode, or a material of the second bottom electrode is different from a material of the second upper electrode.

5. The micro LED display device as claimed in claim 1, wherein the micro LED structure further comprises:
   a buffer layer surrounding the epitaxial structure, wherein the first electrode and the second electrode are disposed on the buffer layer.

6. The micro LED display device as claimed in claim 5, wherein a top surface of the epitaxial structure and a top surface of the buffer layer are coplanar.

7. The micro LED display device as claimed in claim 5, wherein a distance between a top surface of the epitaxial structure and the display back plate is greater than a distance between a top surface of the buffer layer and the display back plate.

8. The micro LED display device as claimed in claim 5, wherein a Young's modulus of the buffer layer is less than a Young's modulus of the epitaxial structure.

9. The micro LED display device as claimed in claim 1, wherein the epitaxial structure comprises:
   a first-type semiconductor layer;
   a light-emitting layer disposed on the first-type semiconductor layer; and
   a second-type semiconductor layer disposed on the light-emitting layer;
   wherein the first electrode is electrically connected to the first-type semiconductor layer, and the second electrode is electrically connected to the second-type semiconductor layer.

10. The micro LED display device as claimed in claim 1, further comprising a plurality of pixels, wherein the display back plate comprises a display region, the pixels are arranged in an array in the display region, each of the pixels comprises a plurality of micro LED structures, and the micro LED structures emit lights with different colors.

11. A micro LED display device, comprising:
   a display back plate having a first connecting electrode and a second connecting electrode and divided into a display region and a non-display region surrounding the display region;
   a plurality of pixels arranged in an array in the display region, wherein each of the pixels comprises:
      a plurality of micro LED structures disposed on the display back plate, wherein the micro LED structures emit lights with different colors, and each of the micro LED structures comprises:
         an epitaxial structure; and
         a first electrode and a second electrode electrically connected to the epitaxial structure and disposed on a side of the epitaxial structure closest to the display back plate, wherein the first electrode has an extension portion, the second electrode has an extension portion, and an orthogonal projection of the extension portion of the first electrode on the display back plate and an orthogonal projection of the extension portion of the second electrode on the display back plate both exceed an orthogonal projection of the epitaxial structure on the display back plate; and
         a buffer layer formed on the outside of the epitaxial structure to connect the micro LED structures, wherein the first electrode and the second electrode are disposed on the buffer layer; and
      a first bonding structure and a second bonding structure disposed between the display back plate and each of the micro LED structures, wherein the first bonding structure is in direct contact with the extension portion of the first electrode and the first connecting electrode, the second bonding structure is in direct contact with the extension portion of the second electrode and the second connecting electrode, and neither an orthogonal projection of the first bonding structure nor an orthogonal projection of the second bonding structure on the display back plate overlaps an orthogonal projection of a bottom surface of the epitaxial structure on the display back plate.

12. The micro LED display device as claimed in claim 11, wherein a bottom surface of the buffer layer is separated from the display back plate.

* * * * *